(12) United States Patent
Iguchi et al.

(10) Patent No.: US 6,597,209 B2
(45) Date of Patent: *Jul. 22, 2003

(54) SEMICONDUCTOR LASER DRIVING CIRCUIT

(75) Inventors: Akiyoshi Iguchi, Tokyo (JP); Kenyo Tobita, Tokyo (JP); Yoshiharu Unami, Tokyo (JP)

(73) Assignee: Fujikura Ltd., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/431,281

(22) Filed: Nov. 1, 1999

(65) Prior Publication Data

US 2002/0181520 A1 Dec. 5, 2002

(30) Foreign Application Priority Data

Nov. 2, 1998  (JP) ............................................. 10-312341

(51) Int. Cl.[7] ................................................. H03B 1/00
(52) U.S. Cl. ..................................... 327/108; 372/38.02
(58) Field of Search ............................ 327/108; 372/26, 372/27, 29.014, 29.015, 29.016, 38.02, 38.07

(56) References Cited

U.S. PATENT DOCUMENTS

| 5,809,049 A | * | 9/1998 | Schaefer et al. | ............... 372/38 |
| 5,883,910 A | * | 3/1999 | Link | ........................ 372/38.07 |
| 6,078,601 A | * | 6/2000 | Smith | ........................... 372/38 |

* cited by examiner

Primary Examiner—Terry D. Cunningham
Assistant Examiner—Quan Tra
(74) Attorney, Agent, or Firm—Oblon, Spivak, McClelland, Maier & Neustadt, P.C.

(57) ABSTRACT

A resistor is connected in series with a vertical cavity surface emitting laser, and DC bias electric current is supplied thereto from a DC bias electric current supplying circuit by way of an inductor. Input data is inputted from a differential input line to a voltage amplifier by way of a PECL input buffer, for voltage amplification. The amplified signal is attenuated by an attenuator, transferred to a transfer line by way of a capacitor for AC coupling, and applied to the series resistance and the vertical cavity surface emitting laser. The voltage amplifier has a peak in its frequency characteristics and is structured such that the gain, the frequency band, and the peaking characteristics can be adjusted.

6 Claims, 9 Drawing Sheets

WAVEFORM OF DRIVING ELECTRIC CURRENT

WAVEFORM OF VCSEL LIGHT OUTPUT

EYE MASK

WAVEFORM OF MODULATION ELECTRIC CURRENT

WAVEFORM OF DRIVING ELECTRIC CURRENT OF VCSEL

SEMICONDUCTOR LASER DRIVING CIRCUIT

BACKGROUND OF THE INVENTION

1. Field of the Invention

The present invention relates to a semiconductor laser driving circuit in which rise and fall time of waveform when a pulse modulation signal is provided to a vertical cavity surface emitting laser is improved.

2. Description of the Related Art

Conventionally, a modulation electric current driving circuit in a semiconductor laser driving circuit for high-speed optical communication is constructed as an electric current switch type in which a transistor or a field effect transistor (FET) has a differential construction.

FIG. 1 shows an example of the conventional structure of a driving circuit of a vertical cavity surface emitting laser (referred to as "VCSEL" hereinafter). Transistors Tr1 and Tr2 constitute a differential switch circuit, and an emitter of Tr1 and Tr2 is connected to a constant electric power source which supplies a constant electric current Im. A collector of Tr1 is connected to the cathode of the VCSEL by way of a resistor R1 and a voltage $V_{CC}$ is supplied to the anode of the VCSEL. On the other hand, a collector of Tr2 is connected to a resistor R2 and a voltage $V_{CC}$ is supplied to the other terminal of the resistor R2. A DC bias electric current supplying circuit is connected to the VCSEL on the cathode side thereof by way of an inductor L1, so that DC bias electric current $I_{dc}$ can be controlled.

Data is inputted from differential inputs TX+ and TX− by way of an input buffer. When the logic "1" is inputted to the TX+, Tr1 is turned "ON" and modulation electric current Im is supplied to the VCSEL, resulting in emission of light. When the logic "0" is inputted to the TX+, Tr1 is turned "OFF" and modulation electric current Im is not supplied to the VCSEL, resulting in a non-emission state of light.

In general, in a semiconductor laser driving circuit including a VCSEL, DC bias electric current which is approximately of the level of the threshold electric current $I_{th}$ is constantly supplied and pulse modulation electric current is coupled thereto, in order to improve the turn-on delay of the laser.

However, in the case of a VCSEL, due to the carrier accumulation effect in its active region, its rise time and fall time tend to become long when the modulation is carried out at a high speed. Accordingly, there arises a problem that required rise and fall time and required specifications of the eye pattern mask may not be achieved in a VCSEL.

For example, in a modulation electric current driving circuit of the electric current switching type as shown in FIG. 1, since the modulation electric current is coupled with the DC bias electric current by DC coupling, the modulation electric current becomes zero when the light emitting element stops emitting light (at the time of the logic "0" level). However, as shown in FIG. 2A, the driving electric current does not decrease to the value of the DC bias electric current or lower. Therefore, the waveform of light output of the VCSEL has, as shown in FIG. 2B, quite large values of rise time tr and fall time tf due to the carrier accumulation effect to an active region of the VCSEL. Rise time and fall time are normally specified from 20% to 80% of the logic High level. In the case of a VCSEL, a portion larger than 80% or so rises up quite moderately in the rising and a portion smaller than 20% or so falls down quite moderately in the falling. Due to these moderate rise time and fall time, as shown in FIG. 3, the resulting eye pattern cannot suffice the predetermined eye mask of standard level.

SUMMARY OF THE INVENTION

The object of the present invention is to provide a semiconductor laser driving circuit in which rise and fall time of waveform when a pulse modulation signal is provided to a vertical cavity surface emitting laser is improved such that the eye pattern can suffice the predetermined eye mask of standard level.

In order to achieve the aforementioned object, there is provided a semiconductor laser driving circuit comprising: a bias electric current supplying circuit for supplying a bias electric current to a vertical cavity surface emitting laser; and a modulation signal circuit for amplifying input data according to frequency characteristics having a peak in the high value region thereof and coupling the amplified signal as a pulse modulation signal with the bias electric current.

Due to the structure described above, an overshoot and an undershoot can be added to the rise portion and the fall portion of the pulse modulation signal, respectively.

In a preferred embodiment of the present invention, the modulation signal circuit has a peaking adjustment circuit for variably adjusting peaking in the frequency characteristics.

In a preferred embodiment of the present invention, the modulation signal circuit has, at its output end, a capacitor for AC coupling.

In a preferred embodiment of the present invention, the modulation signal circuit has an attenuator on the downstream side of a voltage amplifier.

In a preferred embodiment of the present invention, the modulation signal circuit has a gain adjusting circuit for variably adjusting gains of a voltage amplifier.

Further, in order to achieve the aforementioned object, there is provided a semiconductor laser driving circuit comprising: a bias electric current supplying circuit for supplying a bias electric current to a vertical cavity surface emitting laser; and a modulation signal circuit for inputting input data and coupling the input signal as a pulse modulation signal with the bias electric current; and a differentiating circuit for inputting the input data, generating a differential waveform according to the input data and coupling the differential waveform with a rise portion and a fall portion of the pulse modulation signal.

Due to the structure described above, an overshoot and an undershoot can be added to the rise portion and the fall portion of the pulse modulation signal, respectively.

In the preferred embodiment of the present invention, the differentiating circuit has a buffer at its output end.

In the preferred embodiment of the present invention, the semiconductor laser driving circuit further comprises a variable attenuator provided on the upperstream side or on the downstream side of the differentiating circuit.

The nature, principle and utility of the invention will become more apparent from the following detailed description when read in conjunction with the accompanying drawings.

DESCRIPTION OF THE PREFERRED EMBODIMENTS

A preferred embodiment of the present invention will be described in detail hereinafter with reference to the accompanying drawings.

Figure 1:
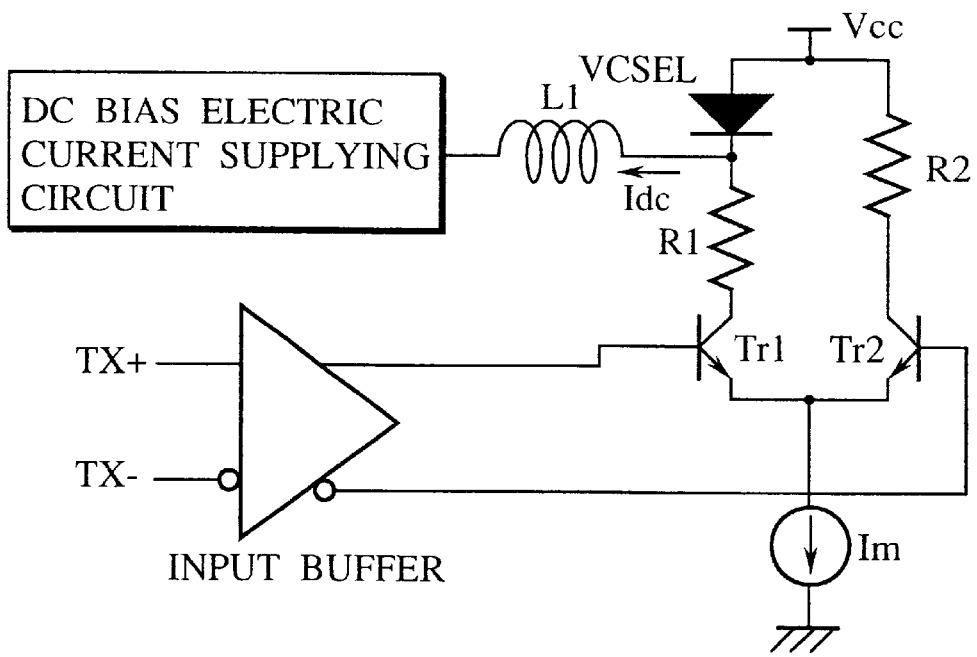
FIG. 1 is a structural view of a conventional driving circuit of a vertical cavity surface emitting laser.
Figure 2A:
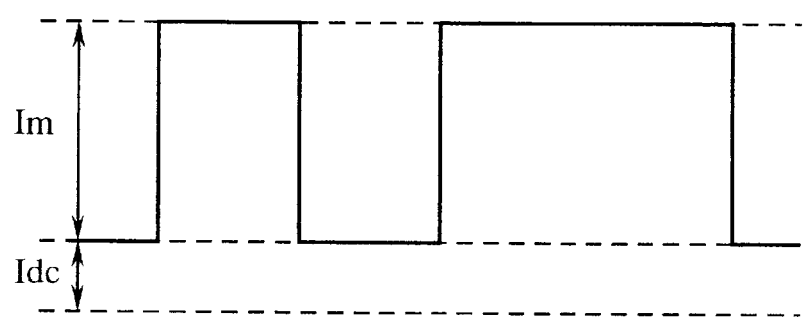
FIG. 2A is a view which shows a waveform of a driving electric current.
Figure 2B:
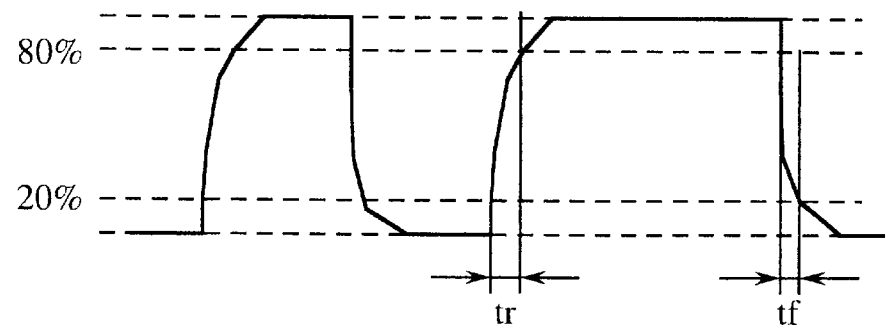
FIG. 2B is a view which shows a waveform of a VCSEL light output.
Figure 3:
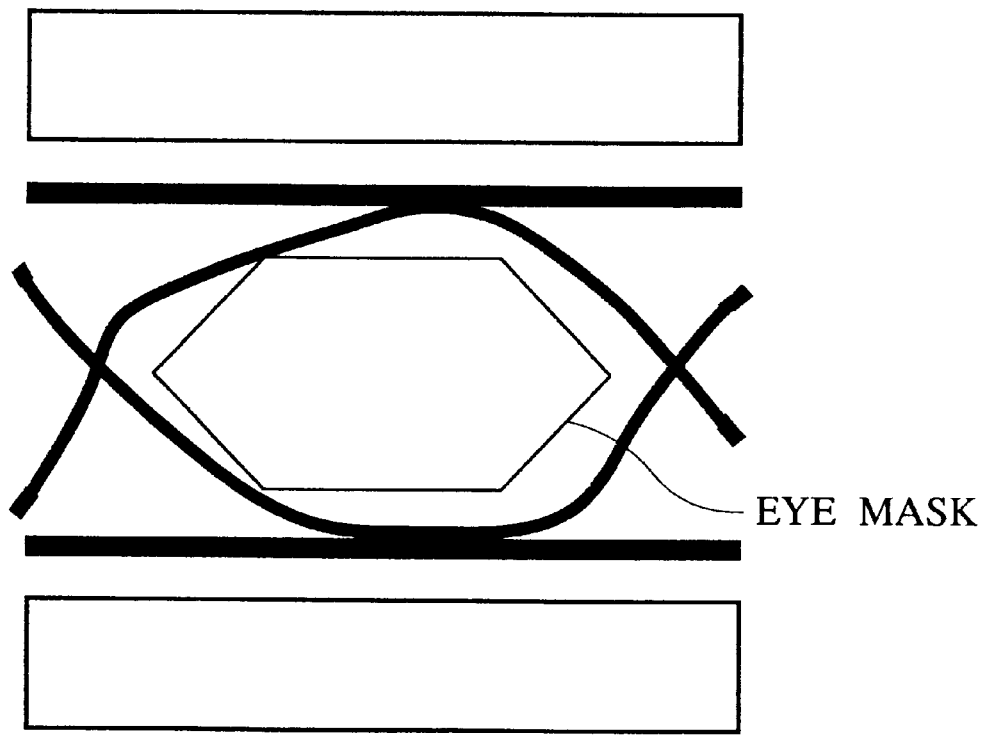
FIG. 3 is a view which shows an eye pattern produced by a conventional driving circuit of a vertical cavity surface emitting laser.
Figure 4:
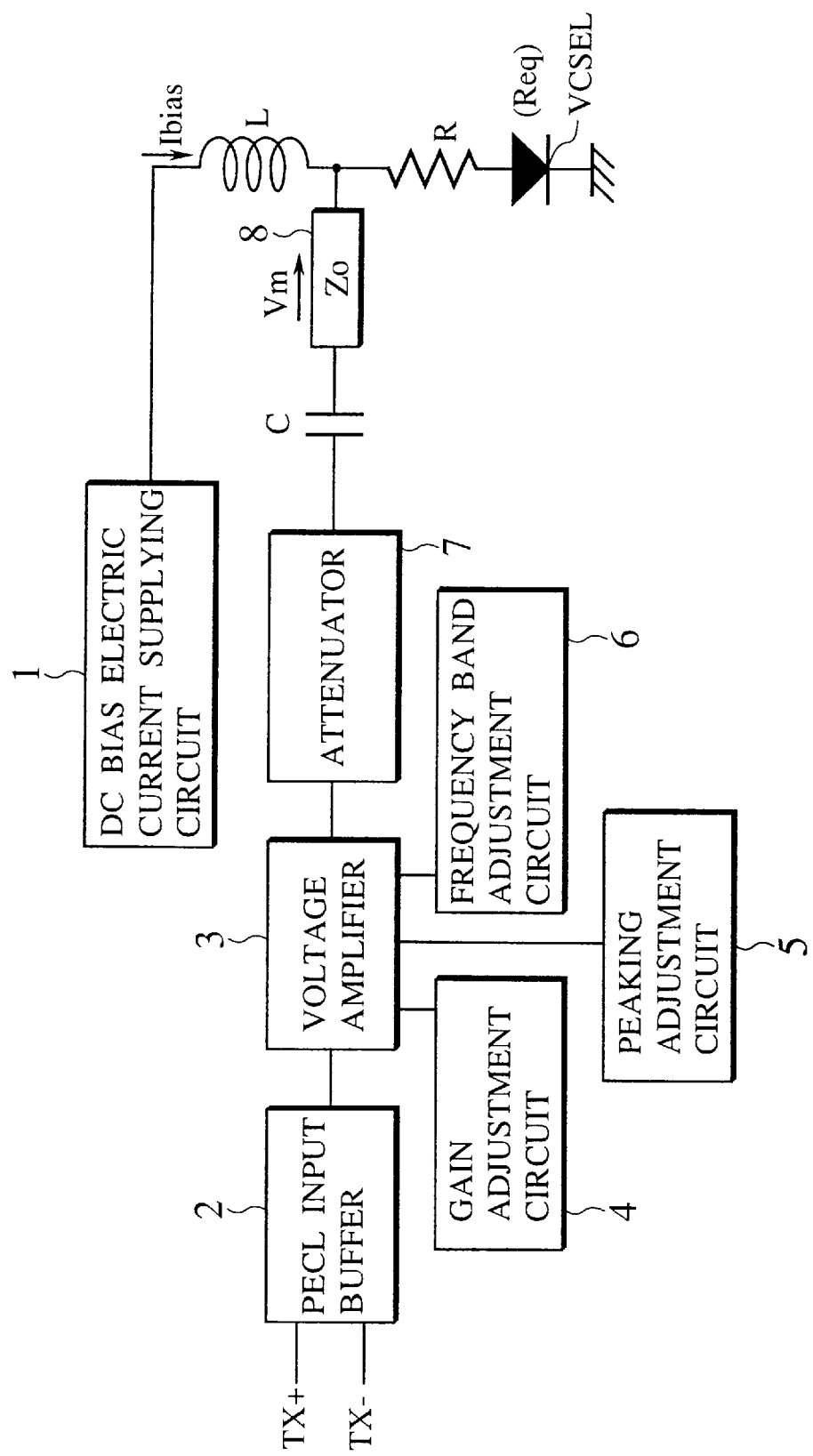
FIG. 4 is a structural view of a semiconductor laser driving circuit of the present invention.

FIG. 4 shows a structure of a semiconductor laser driving circuit of the present invention. A resistor R is connected in series with a VCSEL. DC bias electric current $I_{bias}$ is supplied from a DC bias electric current supplying circuit 1 to the VCSEL and the resistor R by way of an inductor L. Input data is inputted from differential inputs TX+, TX− into a voltage amplifier 3 by way of a PECL (positive referenced emitter coupled logic) input buffer 2, such that the voltage of the input data is amplified. The data is then attenuated by an attenuator 7 and sent to a transmission line 8 (a characteristic impedance $Z_o$) by way of a capacitor C for AC coupling, and applied to the resistance R and the VCSEL.

The voltage amplifier 3 has a peak in the high value region of frequency characteristics, and is constructed such that gains, the frequency band, and the peak characteristics can be adjusted. Specifically, a gain adjustment circuit 4 carries out gain adjustment, a peaking adjustment circuit 5 adjusts the peak characteristics, and a frequency band adjustment circuit 6 adjusts the frequency band.

Figure 5:
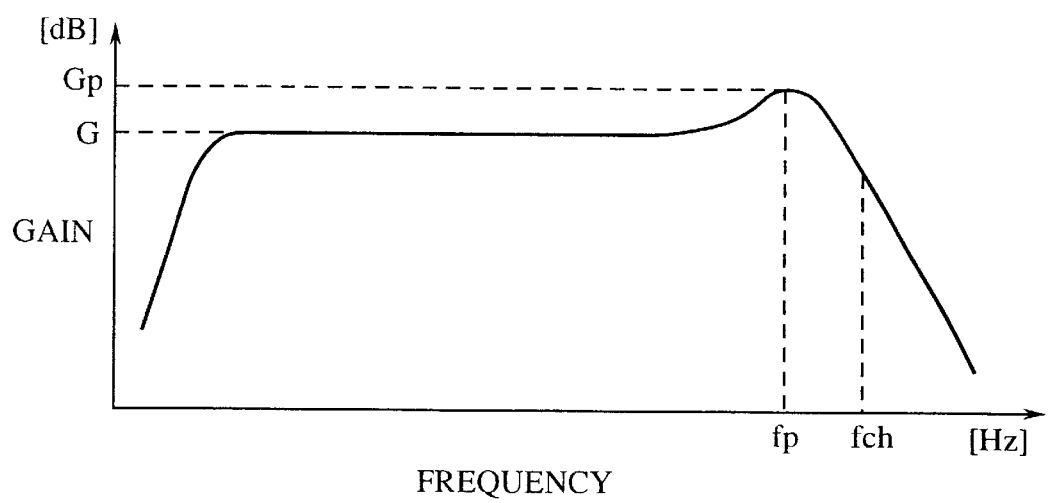
FIG. 5 is a view which shows an example of frequency characteristics of a voltage amplifier.
Figure 6A:
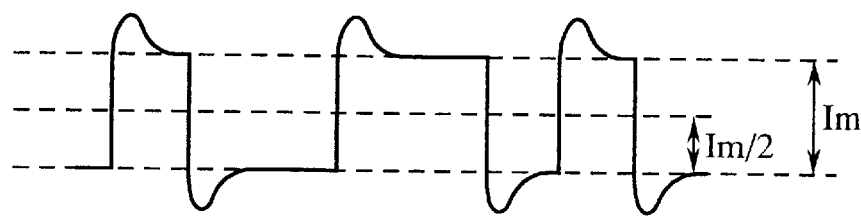
FIG. 6A is a view which shows a waveform of modulation electric current.

In the semiconductor laser driving circuit having the aforementioned structure, the waveform of the modulation electric current flowing in the VCSEL reflects the frequency characteristics of the voltage amplifier 3. FIG. 5 shows an example of the frequency characteristics of the voltage amplifier 3, in which a peak occurs at the frequency $f_p$. The frequency $f_{ch}$ is a high-frequency cut-off frequency. Due to peaks generated as a result of adjustment of peaking by the peaking adjustment circuit 5, overshoot and undershoot can be generated in the modulation electric current as shown in FIG. 6A.

Figure 6B:
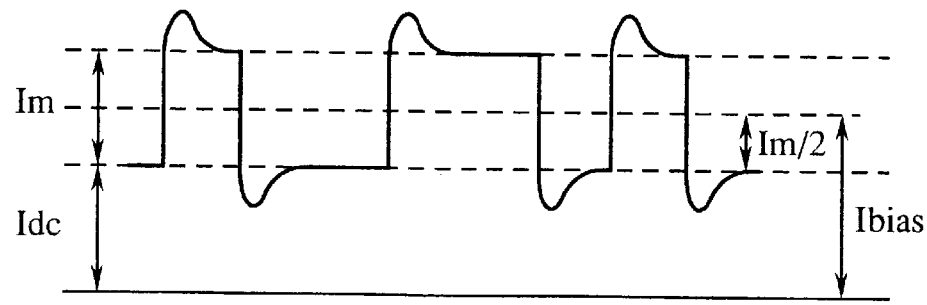
FIG. 6B is a view which shows a waveform of driving electric current of a VCSEL.

When the output of the voltage amplifier 3 is AC-coupled with the VCSEL to which the bias electric current $I_{bias}$ is being supplied, the waveform of the driving electric current of the VCSEL becomes like that shown in FIG. 6B. It should be noted that, in the semiconductor laser driving circuit shown in FIG. 4, the mark ratio of signal pattern which modulates the VCSEL is required to be 1/2 because the modulation electric current is coupled with the bias electric current by AC coupling.

When the bias electric current which the DC bias electric current supplying circuit 1 shown in FIG. 4 supplies to the VCSEL is expressed as $I_{bias}$, and the modulation voltage amplitude as Vm (peak-to-peak), the modulation electric current as Im (peak-to-peak), the DC bias electric current of the VCSEL as $I_{dc}$, the equivalent series resistance of the VCSEL as $R_{eq}$, the following equations (1) and (2) are obtained.

$$Im=Vm/(R+R_{eq}) \quad (1)$$

$$I_{dc} \approx I_{bias}-Im/2 \quad (2)$$

During the transition period from a non-emitting state to a light-emitting state, injection of carriers to an active region of the VCSEL is accelerated due to the overshoot in the modulation electric current, so that the rise time of light output of the VCSEL can be shortened. In addition, during the transition period from a light-emitting state to a non-emitting state, as the modulation electric current is coupled with the bias electric current by AC coupling, the electric current supplied to the VCSEL by the undershoot of the modulation electric current becomes smaller than the threshold electric current value $I_{th}$ of the VCSEL. Accordingly, "extraction" of the carriers inside the active region of the VCSEL is accelerated, shortening the fall time of light output of the VCSEL. It should be noted that $I_{th}$ is approximately equal to $I_{dc}$ (DC bias electric current).

The magnitude of overshoot and the magnitude of undershoot of the modulation electric current can be adjusted by controlling the peaking frequency $f_p$ and the peaking gain $G_p$ of the frequency characteristics of the voltage amplifier 3. Further, a peak can be provided to the frequency characteristics by a filter which is inserted on the downstream side of the voltage amplifier 3.

The adjustment of electric current values of the modulation electric current can be carried out by providing a structure in which the gain of the voltage amplifier 3 can be varied by the gain adjustment circuit 4 and increasing and decreasing the gain using the structure. Such adjustment can also be realized by making the magnitude of attenuation by the attenuator 7 provided on the downstream side of the voltage amplifier 3 variable.

By making the band-width of the voltage amplifier 3 variable by means of a frequency band adjustment circuit 6, the rise and fall time of the modulation electric current can be controlled. This method is effective when the rise and fall time of the modulation electric current is to be made particularly long. Further, it is possible to effect such adjustment by inserting a lowpass filter on the downstream side of the voltage amplifier 3 and making the band-width of the filter variable.

In a circuit which operates at a high speed, the characteristic impedance of signal line from the voltage amplifier 3 to the VCSEL is to be equal to the output impedance of the voltage amplifier 3, so that a termination with an impedance value which is equal to the output impedance of the voltage amplifier 3 be performed near the VCSEL.

In a semiconductor laser of Fabry-Pérot type, as the equivalent series resistance is distributed in a very narrow range of 2–4 Ω, the series resistance R of FIG. 4 may be 47 Ω or so in order to achieve the characteristic impedance of 50 Ω. However, in a case of a VCSEL, the equivalent series resistance is normally distributed in a relatively wide range of 20–50 Ω. Therefore, when a VCSEL is used, even if the characteristics impedance of a pattern from the output of the voltage amplifier 3 to the VCSEL and the output impedance of the voltage amplifier 3 are set at a certain value $Z_o$, an impedance-mismatch occurs (in a case in which the series resistor R is structured as a fixed resistor having a specific resistance value) because the equivalent series resistance varies depending on the VCSEL element.

Figure 7:
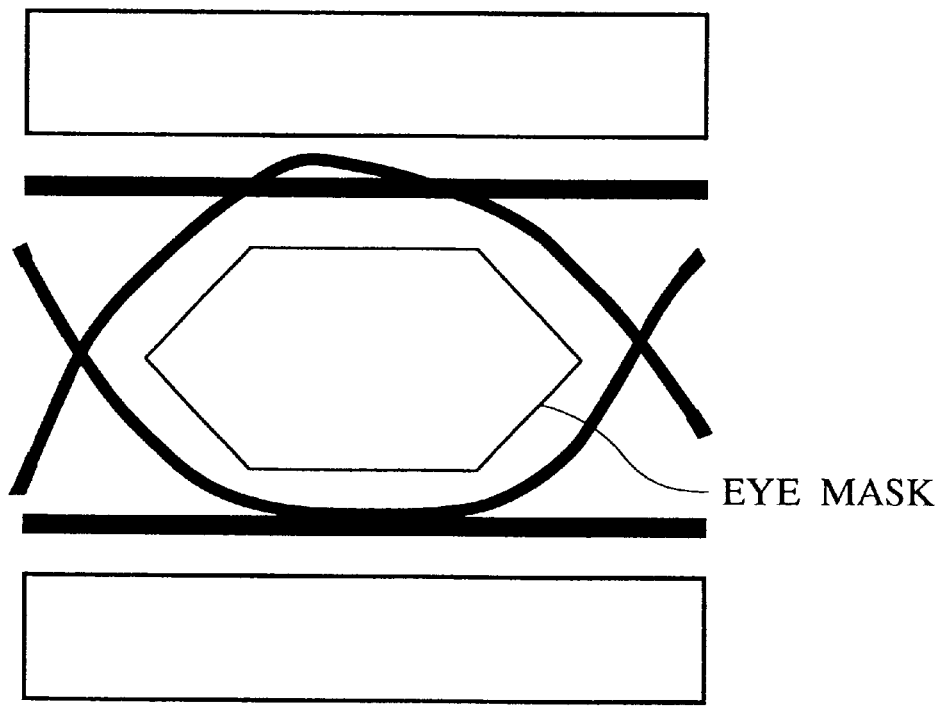
FIG. 7 is a view which shows an eye pattern produced by the semiconductor laser driving circuit of the present invention.

It is not realistic to change the resistance value of the series resistance R in accordance with the value of the equivalent series resistance of each VCSEL element, if the number of processes which will be required (such as measurement of the resistance value of the equivalent series resistance of each element) is considered. However, the impedance mismatch can be suppressed in another manner, by inserting the attenuator 7 on the downstream side of the voltage amplifier 3. By this method, reflection due to the impedance mismatch resulted from variation in the characteristics of the VCSEL can be suppressed and thus deterioration of the waveform of light output is improved. Specifically, an eye pattern as shown in FIG. 7 which suffices the eye mask of required (predetermined) standard can be obtained.

Figure 8:
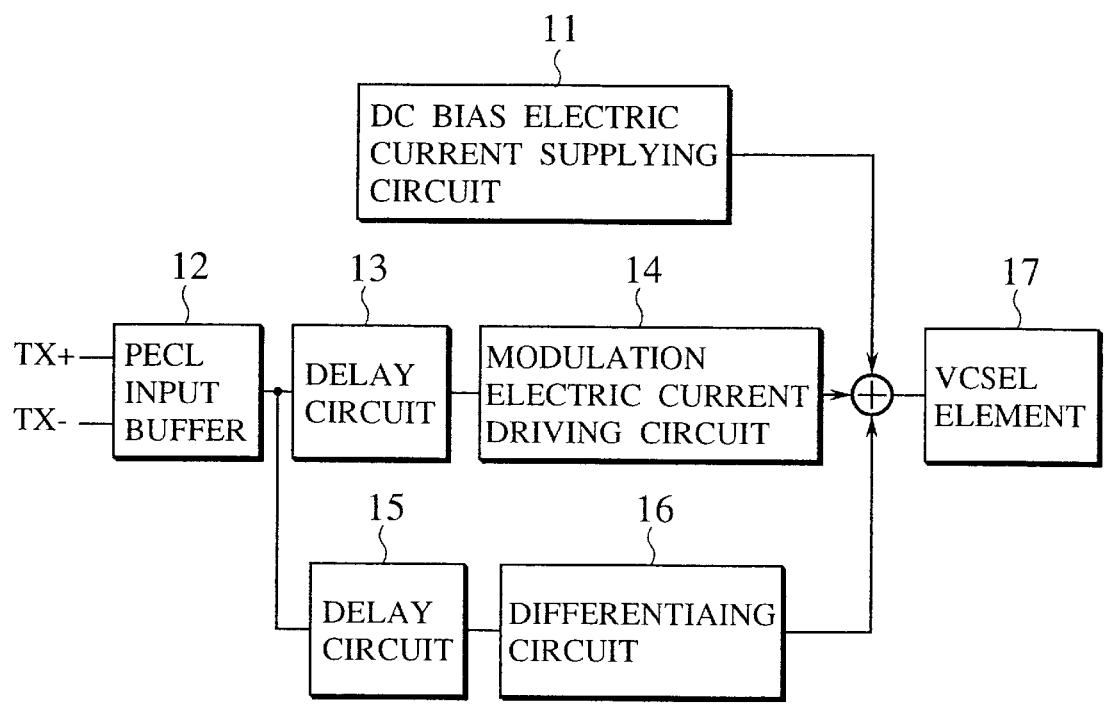
FIG. 8 is a structural view of the semiconductor laser driving circuit in which a differentiating circuit is utilized.

The overshoot and undershoot of the modulation electric current may be formed by means of a differentiating circuit. FIG. 8 shows an example of structure of a semiconductor laser driving circuit in which a differentiating circuit is utilized.

DC bias electric current is supplied from a bias electric current supplying circuit 11 to a VCSEL element 17. Input data is input from differential inputs TX+, TX– by way of a PECL input buffer 12, delayed in a delay circuit 13, modulated to modulation electric current in accordance with the waveform of the input data by a modulation electric current driving circuit 14. The parallel output from the PECL input buffer 12 is delayed in a delay circuit 15, generated as a differential waveform in accordance with the waveform of the input data in a differentiating circuit 16, coupled with the modulation electric current from the modulation electric current driving circuit 14, and applied, together with the DC bias electric current, to a VCSEL element 17.

Figure 9:
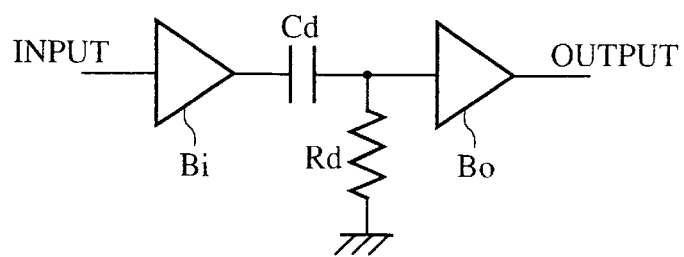
FIG. 9 is a view which shows an example of the differentiating circuit.

FIG. 9 shows an example of the structure of the differentiating circuit 16. Signals inputted by way of an input buffer Bi are made to have a differential waveform in a differentiating circuit which is constituted of a capacitor Cd and a resistor Rd, and outputted by way of an output buffer Bo.

Figure 10:
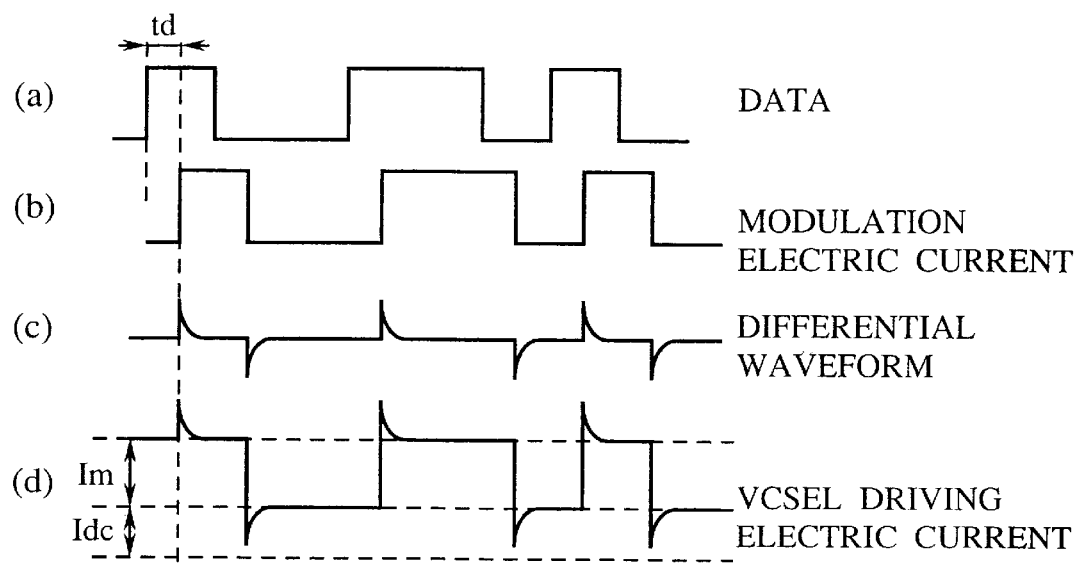
FIG. 10 is a view showing a waveform of input data, a waveform of modulation electric current, a differential waveform, and a waveform of VCSEL driving electric current.

FIG. 10(a) shows a waveform of the input data. This input data is delayed by the time td by the delay circuit 13 and then has a modulation electric current waveform as shown in (b) of FIG. 10 in the modulation electric current driving circuit 14. In the differentiating circuit 16, electric current having a differential waveform as shown in (c) of FIG. 10 is generated. By coupling the electric current shown in (c) of FIG. 10 with the modulation electric current of (b) of FIG. 10 and the bias electric current from the DC bias electric current supplying circuit 11, the driving electric current of the VCSEL 17 is eventually made to have a waveform shown in (d) of FIG. 10.

During the transition period from a non-emitting state to a light-emitting state of the VCSEL element 17, injection of the carriers into an active region of the VCSEL is accelerated due to the overshoot of the modulation electric current, and thus the rise time of light output of the VCSEL can be shortened. In addition, during the transition period from a light-emitting state to a non-emitting state, the electric current supplied to the VCSEL becomes smaller than the threshold electric current value $I_{th}$ of the VCSEL due to the undershoot of the modulation electric current. As a result, "extraction" of the carriers inside the active region of the VCSEL is accelerated, shortening the fall time of light output of the VCSEL.

In a case in which there exists a phase-difference between the modulation electric current generated by the modulation electric current driving circuit 14 and the differential electric current formed by the differentiating circuit 16, the delay circuits 13, 15 are provided so that such a difference be compensated.

The resistance value of the resistor Rd constituting the differentiating circuit 16 is about the same as the resistance value of the resistor of the semiconductor laser driving circuit. Therefore, it is preferable to insert a buffer into the output of the differentiating circuit.

Figure 11:
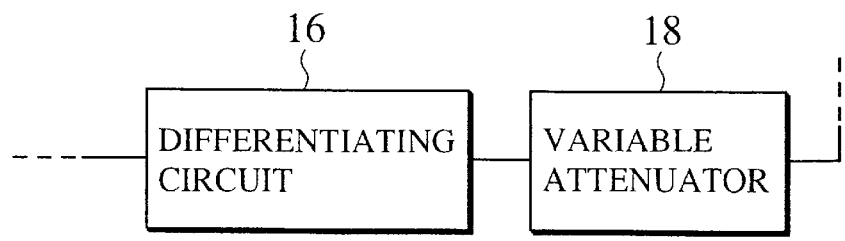
FIG. 11 is a view which shows an example in which an attenuator is provided on the downstream side of the differentiating circuit.

Further, the magnitude of overshoot and the magnitude of undershoot can be made variable by providing a variable attenuator on the downstream side or the upperstream side of the differentiating circuit 16. FIG. 11 is a view which shows an example in which a variable attenuator 18 is provided on the downstream side of the differentiating circuit 16.

As described above, according to the semiconductor laser driving circuit of the present invention, an eye pattern which suffices the predetermined eye mask can be obtained by providing overshoot and undershoot in the pulse modulation signal waveform and shortening the rise and fall time of the waveform of light output of a vertical cavity surface emitting laser.

It should be understood that many modifications and adaptations of the invention will become apparent to those skilled in the art and it is intended to encompass such obvious modifications and changes in the scope of the claims appended hereto.

What is claimed is:

1. A semiconductor laser driving circuit comprising:
    a bias electric current supplying circuit for supplying bias electric current to a vertical cavity surface emitting laser; and
    a modulation signal circuit having frequency characteristics of gain with a peak in the high frequency region thereof, said modulation signal circuit amplifying input data according to the frequency characteristics and coupling the amplified signal as a pulse modulation signal with a bias electric current.

2. A semiconductor laser driving circuit of claim 1, wherein the modulation signal circuit has a peaking adjustment circuit for variably adjusting peaking in the frequency characteristics.

3. A semiconductor laser driving circuit of claim 1,
    wherein the modulation signal circuit has, at an output end thereof, a capacitor for AC coupling.

4. A semiconductor laser driving circuit of claim 1, wherein the modulation signal circuit has an attenuator on the downstream side of a voltage amplifier of the modulation signal circuit.

5. A semiconductor laser driving circuit of claim 1, wherein the modulation signal circuit has a gain adjusting circuit for variably adjusting gains of a voltage amplifier of the modulation signal circuit.

6. A semiconductor laser driving circuit of claim 1, wherein the frequency characteristics have a gain including a flat portion in low and middle frequency regions thereof and a peak in the high frequency region thereof, the peak having a value larger than a value of the flat portion.

* * * * *